United States Patent [19]

Feddersen

[11] 4,176,602

[45] Dec. 4, 1979

[54] DRY FILM SCREEN STENCIL AND METHOD OF MAKING

[75] Inventor: Phyllis A. Feddersen, Pomona, Calif.

[73] Assignee: General Dynamics Corporation, Pomona, Calif.

[21] Appl. No.: 805,493

[22] Filed: Jun. 10, 1977

Related U.S. Application Data

[63] Continuation-in-part of Ser. No. 609,843, Sep. 2, 1975, abandoned.

[51] Int. Cl.² .......................... B41H 1/24; B41C 1/14
[52] U.S. Cl. .................................. 430/308; 101/128.4
[58] Field of Search ............... 101/128.2, 128.3, 128.4, 101/401.1; 156/904, 905; 96/36.2, 36.4

[56] References Cited

U.S. PATENT DOCUMENTS

| | | | |
|---|---|---|---|
| 2,949,848 | 8/1960 | Mott | 101/128.3 |
| 2,969,732 | 1/1961 | Kendall | 101/128.3 |
| 3,100,702 | 8/1963 | Rauner et al. | 96/33 |
| 3,376,138 | 4/1968 | Giangualano et al. | 96/36.2 |
| 3,469,982 | 9/1969 | Celeste | 96/35.1 |
| 3,507,654 | 4/1970 | Wrench | 96/36.4 |
| 3,526,504 | 9/1970 | Celeste | 96/36.2 X |
| 3,532,052 | 10/1970 | Erickson | 101/128.3 |
| 3,676,128 | 7/1972 | Leopold et al. | 96/36.4 |
| 3,836,367 | 9/1974 | Klemm | 101/128.3 X |
| 3,853,561 | 12/1974 | Reichel et al. | 96/35.1 X |

FOREIGN PATENT DOCUMENTS 2050285 10/1970 Fed. Rep. of Germany ........ 101/128.3

OTHER PUBLICATIONS

Riston Brochure dated 3-71.

Primary Examiner—E. H. Eickholt
Attorney, Agent, or Firm—Freling E. Baker; Neil F. Martin; Edward B. Johnson

[57] ABSTRACT

A method of making a relatively thick dry film stencil for uses such as depositing solder paste through a screen chase. A stencil consisting of four mil thick dry film photoresist is formed by passing the photoresist layers through a roller and laminating them onto a support screen. The outer protective film coatings are removed and the film photoresist developed. It is then placed in a chase with the developed film face on the bottom. The solder paste is then squeegeed through the screen and deposited on a desired part. An alternate method of making the stencil uses two layers of dry film photoresist laminated together with the protective film coating removed. The stencil is cut to the size needed and exposed. Using a hydraulic press, the stencil is then connected to a screen in a chase by applying a pressure of 250 psi at 300° F. for 10 seconds.

22 Claims, 13 Drawing Figures

LAMINATE

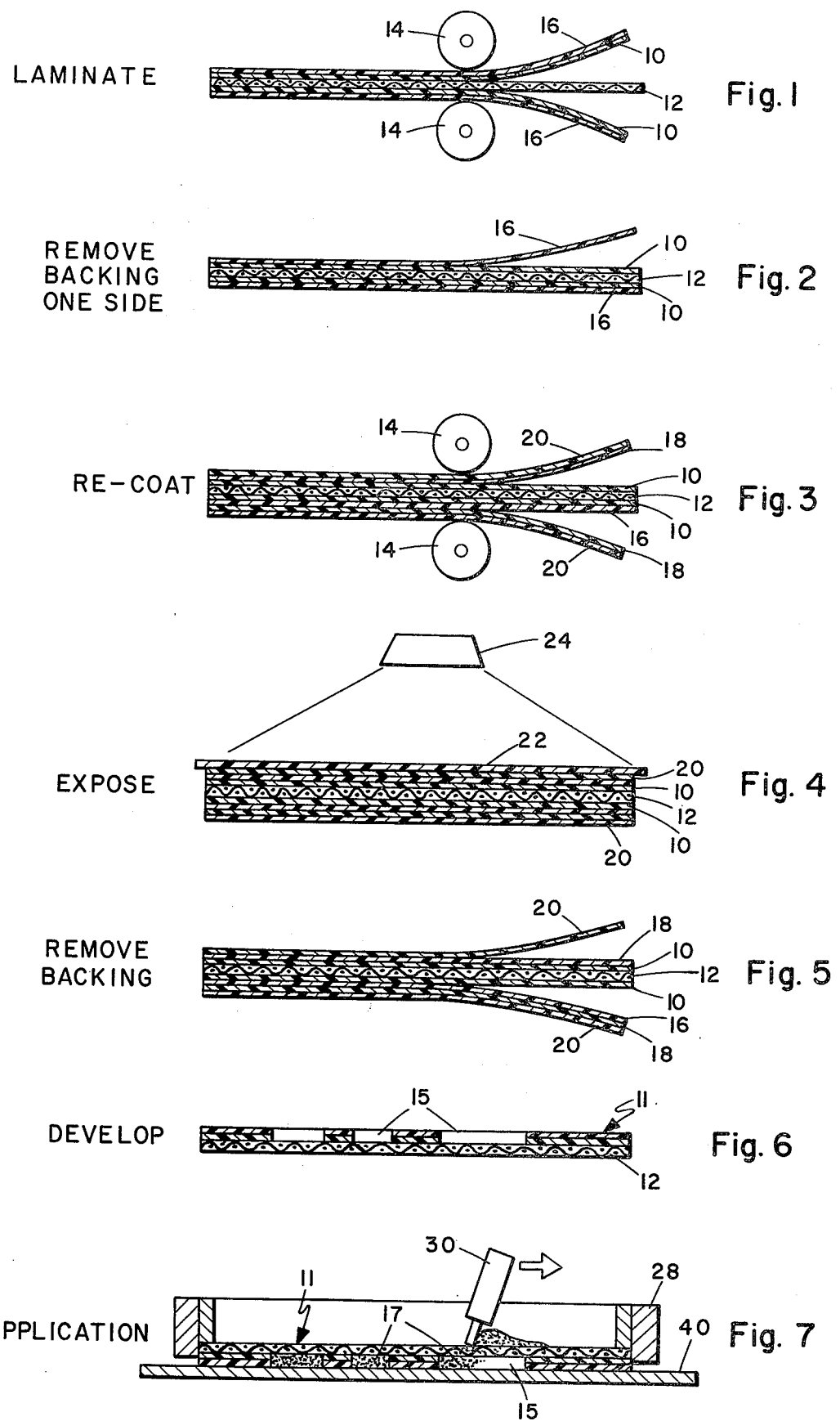

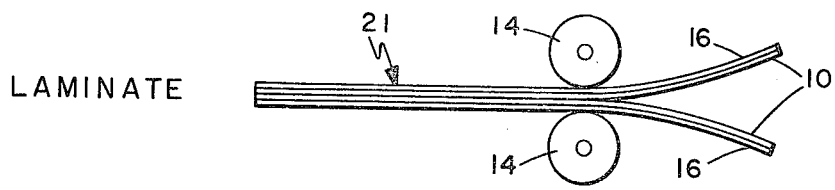
LAMINATE  Fig. 8
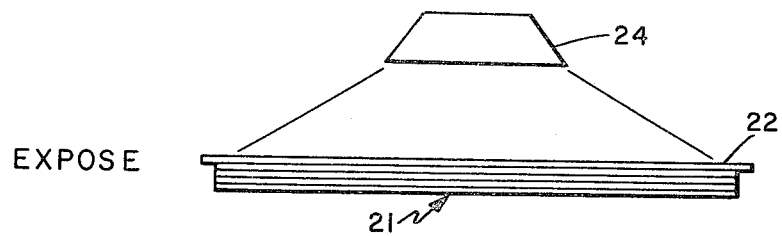
EXPOSE  Fig. 9
REMOVE BACKING ONE SIDE  Fig. 10
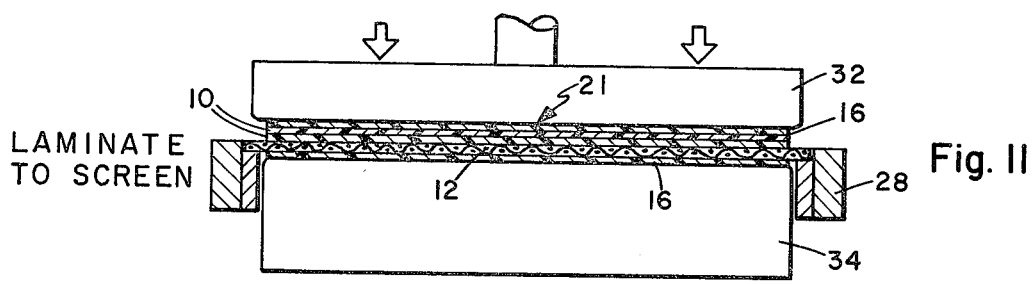
LAMINATE TO SCREEN  Fig. 11
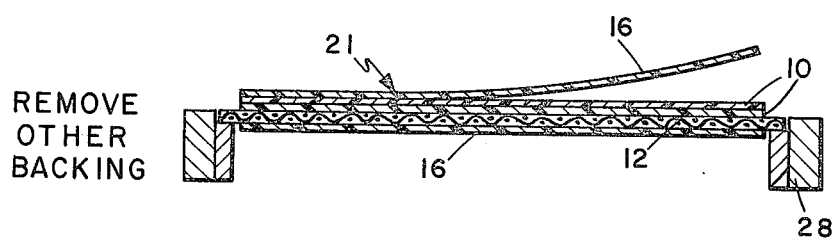
REMOVE OTHER BACKING  Fig. 12
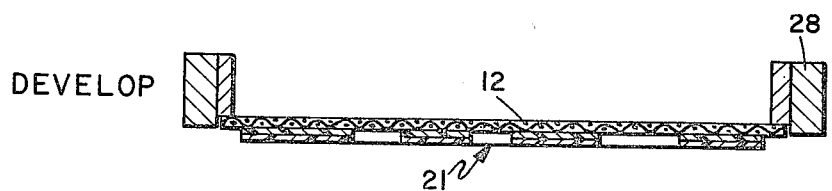
DEVELOP  Fig. 13

DRY FILM SCREEN STENCIL AND METHOD OF MAKING

REFERENCE TO RELATED APPLICATION

The present application is a Continuation-In-Part of my co-pending application Ser. No. 609,843, filed Sept. 2, 1975, and entitled "Dry Film Screen Stencil" now abandoned.

BACKGROUND OF THE INVENTION

Stencil screens, commonly known as silk screens, are usually prepared by coating a screen material with a photosensitized emulsion. Selective portions of the screen are exposed to light and the screen is developed to harden the emulsion in desired areas. The screens produced by these methods are generally satisfactory for most purposes, but are somewhat deficient when used for printed circuits where a relatively large thickness of material, such as solder paste, must be deposited. They are also unsatisfactory where controlled and/or uniform thickness is required.

The prior art has pursued this problem of producing relatively thick printed circuits without substantial success. According to the prior art, a stencil is prepared by coating a screen with a photoresist emulsion, and then recoating the screen several times. The deficiency of this method is that the emulsion has a tendency to run and produce high and low spots, rendering the stencil unsatisfactory for precise printed patterns. In some instances, the screen commonly of stainless steel, is placed on the emulsion while wet. Then, uniform pressure is applied to the assembly, and the emulsion is allowed to dry under pressure. A positive transparency is then applied to the screen. The stencil is then exposed to light. The exposed emulsion hardens and the remaining emulsion is dissolved and washed away. The resulting stencil is characterized by identical hardened emulsion patterns on both sides of the screen. This process is also very time consuming, not only in the use of the many steps, but the time required to dry the photoresist.

Similar prior art systems utilize pliable photoresist film that is exposed while wet and applied to the opposite sides of the screen. The photoresist is then dried and developed. In either of the previously mentioned methods, the stencil is placed in a chase and placed over a part such as a printed circuit board. The desired material, such as a solder paste, is deposited on the part by squeegeeing through the openings defined by the hardened emulsion on the screen.

The prior art processes as described above and other conventional processes are, to a limited extent, capable of producing a stencil of adequate thickness for most applications. The processes, however, are deficient in that they require a multiplicity of delicate steps. It is necessary to subject the wet emulsion to excessive handling. Extreme care is often required to prevent injuring the integrity of the emulsion. Furthermore, it is difficult to avoid improper handling of the emulsion since the stencil must be processed in various pieces of equipment while still wet. There are several other alternative steps and other methods utilized to facilitate the preparation of a stencil. However, none of these other processes are effective to substantially cure the deficiencies of present stencil production.

The prior art is exemplified by the following U.S. Patents:

U.S. Pat. No. 2,969,732, issued January of 1961 to Kendall, discloses the above described method of making a stencil by applying coatings of wet photo sensitive resins to a supporting base and thereafter using the coated supporting base to form a stencil. This disclosed process has the deficiencies as pointed out above, including the resultant inaccuracy of the stencil as well as the time consuming process of making the stencil.

U.S. Pat. No. 2,949,848, issued August of 1960 to Mott, discloses a stencil making method wherein duplicating stencils are prepared xerographically. In the process a screen is attached to a tacky binder material in the process of making the stencil. The layer of material is put in a tacky state by the application of heat or a solvent and is attached by placing the screen over the tacky material and applying a pressure, forcing it into the tacky layer.

U.S. Pat. No. 3,100,702, issued August of 1963 to Rauner et al, discloses a dry processed photothermographic printing plate and process. This patent discloses the transfer of softened matrix to a support, wherein light sensitive resin of a matrix sheet is hardened in exposed areas. The matrix material is heated to soften it, and thereafter is transferred to a sheet or duplicating master sheet. This patent, of course, does not relate to the process of stencil screen making, but to the process of printing plate making.

U.S. Pat. No. 3,507,654, issued April of 1970 to Wrench, is directed to a stencil screen and method. This patent discloses a plurality of steps in a method of applying a photo sensitive emulsion over a coating and then disposing a screen on the layer of wet emulsion, causing the emulsion to permeate the screen. The emulsion is then exposed to a light through a positive, and the unexposed areas washed out. This again is the application of a wet emulsion photo sensitive material to a screen support somewhat similar to the method disclosed in the above described Kendall patent.

U.S. Pat. No. 3,532,052, issued October of 1970 to Erickson; and U.S. Pat. No. 3,676,128, issued July of 1972 to Leopold et al; both disclose somewhat similar techniques of applying dry film photoresist to a screen. However, the dry film photoresist in both disclosed processes are not applied in the dry film state. In both instances, the film is made to adhere to the support screen by softening the film by means of a solvent. In other words the formerly dry film photoresist is turned to a wet film before applying to a screen. In Erickson, for example, Column 3 lines 6 through 19, the technique is described as including "a liquid emulsion for securing this layer to the contact side of a screen, the liquid emulsion being applied to the screen from the top side thereof through and substantially filling the mesh of the screen and a liquid emulsion having characteristics of joining and becoming homogenious with a prepared contact layer of emulsion and thereby forming a complete colloid which has uniform contact layer and a firm mounting on a screen material". These patents, for example, make it abundantly clear that they did not consider it possible to apply a dry film photoresist to a support screen with the photoresist essentially in its dry state. The Leopold patent, similarly describes a process, in Column 2 for example, lines 15 through 22, wherein a complex which is made to adhere to a gauze from the inner side of the frame by wetting it with a solvent. In Column 1, lines 68 through 70, this patent describes a complex film as adapted to be supplied to the operator in rolls or, alternately, it is pre-cut to size. This apparently refers to material, such as that known as Riston material.

U.S. Pat. No. 3,469,982, issued September of 1969 to Celeste, discloses a process for making photoresist. A photoresist solution is applied to the surface of a thin transparent film as a support backing. There is no disclosure or suggestion therein of applying it or constructing a stencil therefrom.

U.S. Pat. No. 3,853,561, issued December of 1974 to Reichel et al, discloses a process for the preparation of a screen printing stencil using intermediate support for light sensitive layers. The specific disclosure therein is of the use of a specific composition of photoresist materials applied wet to a sheet-like intermediate support. Again a wet coating solution is applied to a screen member as in the previously discussed prior art.

German Pat. No. 2,050,285, issued May of 1972 to Siemens, discloses a method of producing a screen printing plate by laminating a photo sensitive foil to a polished support plate and forming the desired image on the polished plate for the printing characters. This patent simply discloses a technique for making a screen from a flat metal support sheet. It does not suggest the use of dry film photoresist in the construction of a screen stencil or the application of dry film photoresist to a open mesh screen.

The aforementioned patents comprise a fairly comprehensive coverage of the prior art techniques relating to art to which the present invention relates. The deficiencies of these methods as disclosed in the prior art become apparent in comparison to the applicant's invention. In summary, prior art has simply failed to solve the problem for which the applicants invention was devised.

Accordingly, there is a recognized need for a stencil production method that is characterized by simplicity and efficiency and requires minimum handling of wet photoresist.

SUMMARY OF THE INVENTION

It is an object of the invention to provide a new and improved method of making silk screen stencils.

Another object of the invention is to provide a new and improved method of making relatively thick silk screen stencils.

Another object of the invention is to provide a new and improved method of making silk screen stencils of controlled thickness.

Another object of the invention is to provide a new and improved method of making relatively thick silk screen stencils suitable for use with solder paste.

Another object of the invention is to provide a new and improved method of making silk screen stencils that eliminates handling of wet film.

Another object of the invention is to provide a new and improved method of making silk screen stencils utilizing dry film photoresist.

Another object of the invention is to provide a new and improved method of making silk screen stencils utilizing dry film photoresist laminated to a screen prior to exposure.

Another object of the invention is to provide a new and improved method of making silk screen stencils utilizing dry film photoresist that is laminated to a screen after exposure.

Another object of the invention is to provide a new and improved method of making silk screen stencils characterized by clean, efficient and reliable steps utilizing a minimum of complex apparatus.

In accordance with the primary aspect of the invention, a screen stencil is produced by laminating two layers of dry film photoresist through the open mesh of a screen between laminating rollers. The film photoresist is initially supplied with protective coatings which are attached to the outside of the film photoresist. The coating is removed from one side of the screen prior to a second lamination when needed. The second lamination is performed to recoat the initial thickness of dry film to obtain a desired thickness with one more thickness of dry film. The resulting stencil has a thickness such as a four mil thickness of film on one side of the screen and a two mil thickness of film on the other. The thickness of course will also include minor thickness added by the screen. The stencil is then exposed through a transparency. The film is developed to harden the exposed areas and the unexposed film is dissolved and washed away. The stencil is then placed in a chase with the hardened image facing downwardly. the exposure step only exposes the four mil side of the stencil. Therefore, the image will be four mil thick on the underside of the screen only. A fluid, such as solder paste, is then squeegeed through the screen and deposited on a part such as a printed circuit board.

An alternative method of producing the stencil calls for the laminating of two layers of film together without the intermediate screen. The stencil is cut to the size needed and then exposed. One protective coating is removed and the stencil placed on a screen, film side down in a hydraulic press for 10 seconds, under a temperature of 300° F. and a pressure of 250 psi. The temperature and pressure laminate the stencil to a screen while in the chase.

The above and other objects of the invention will be apparent as the description continues and when read in conjunction with the appended drawings.

BRIEF DESCRIPTION OF THE DRAWINGS

FIGS. 1 through 7 illustrate the steps of making and using a stencil according to one technique of the invention.

FIGS. 8 through 13 illustrate the steps of making a stencil by the modified technique.

DETAILED DESCRIPTION OF THE DRAWINGS

As illustrated in the drawings, in preparing a stencil 11 for silk screening, two layers of commercially available dry film photoresist 10 are laminated onto a screen 12 by means of rollers 14. In the preferred embodiment the layers are actually laminated to each other by forcing portions thereof through the spaces in the screen and into contact by the application of pressure and a certain amount of heat if necessary. Other techniques of lamination are possible. However, this technique has the advantage of being fast and clean and places photoresist onto the screen and also in the spaces of the screen. During the development process, portions of photoresist will be removed from the spaces of the screen and from the screen itself.

Dry film photoresist is available on the market such as from the Du Pont Corporation under the trademark RISTON, and from Dynachem Products Corporation simply as dry film photoresist. Dry film photoresist is available in both cold roll and hot roll. Cold roll simply requires the application of pressure in order to apply a layer of film to a surface. Hot roll requires the application of both heat and pressure which is typically applied by means of heated rollers. The temperature and pressure required varies with the manufacturer. It is suggested that the temperature and/or pressure recommended by the manufacturer be used although some lattitude is permissible.

A layer of dry film photoresist cannot be applied directly to one side of a screen in the same manner that it can be applied to the face of a sheet of metal. It will not stay on the screen during developing without a backup layer on the opposite side of the screen.

The dry film photoresist 10 is initially provided with a protective backing 16. The top outer protective backing 16 of film layer 10 must be removed, as in FIG. 2, after which the stencil 11 is recoated with at least another layer by passing the stencil 11 through the rollers 14, as in FIG. 3. In the illustrated embodiment, additional two layers 18 of photoresist are laminated to the layers 10 and 16. After exposing, as illustrated in FIG. 4, the top protective layer 20 and the bottom layers 16, 18 and 20 are removed leaving a laminate consisting of the screen 12, the film layers 10, 18 and bottom film layer 10 which serves as a backing layer. The thickness of the resulting stencil will be the thickness of layers 10 and 18 plus the effect of the screen.

Exposure of the resulting film laminate takes place through a transparency 22 by means of a light source 24 such as an ultraviolet light source, illustrated in FIG. 4. The transparency 22 may be either negative or positive depending upon the deposition requirements of the part to be silk screened. It is important to note that the exposure of the three film layer stencil 11 takes place only on the double thick side of the laminate. In the developing step of FIG. 6, the photoresist on the unexposed side of the screen will not harden. Consequently, the stencil 11 has almost the entire emulsion washed away on one side of the screen 12. On the other side of the screen 12, the emulsion is washed away in the unexposed areas, indicated typically at 15. The stencil 11 is now placed in the chase 28, as in FIG. 7, and a fluid material, such as solder paste is then squeegeed through the stencil 11 by means of a conventional squeegee 30, for depositing solder paste 17 on the surface of a part such as a circuit board 40 against which the stencil is held. Since the photoresist layers 10 or 18 are originally provided in the thicknesses of two mils, the image will be four mils thick plus any thickness added by the volume of the screen material. Therefore, in this method it is possible to obtain a deposition of solder paste or other material on the order of four mil thickness (plus any contribution of the screen). This thickness is necessary for a process such as the filliting of microchips to circuit boards. Any desired thickness can be obtained and controlled by the method of the present invention by the selection and lamination of layers of photoresist of appropriate thickness.

Thus by this method a dry film screen laminate is produced from which a desired screen stencil can be made. The dry film screen laminate comprises a fine mesh screen such as stainless steel or the like having at least one layer of dry film photoresist on each side thereof secured together by lamination through the screen mesh. At least one layer of film on one side of the laminate, hereinafter referred to as the face, defines a predetermined or desired thickness for a selected image. The layer on the other side of the laminate defines a backing layer for retaining the face layer to the screen. The face side, that determines the desired thickness, can be defined by one or more layers of film laminated to the backing layer through screen or other layers as desired. A stencil results from providing selected open areas in the dry film screen laminate.

Different thicknesses of dry film layers may be used to make the stencil to obtain the desired image thickness. For example, if a 4 mil thickness is desired, a 4 mil sheet of dry film may be selected for the face or image side of the stencil screen and a 2 mil (or thinner) thick sheet selected for the backing sheet. Also, multiple sheets or layers of dry film of selected thicknesses may be laminated together on the image side of the screen to provide the desired thickness. The backing sheet should be a minimum thickness equal to the thickness of the screen. This thickness will provide enough material to extend through the openings of the screen to fuse with the facing layer and still at least partially cover the back of the screen.

A similar stencil 21 may be obtained by laminating two layers 10 of photoresist together between the rollers 14, but this time eliminating, at least initially, the screen 12, as in FIG. 8. The stencil 21, consisting of the two layers 10 of photoresist and the protective backings 16 is then exposed to the ultraviolet light 24, through a positive or negative transparency 22, as in FIG. 9. It is then necessary to strip one of the protective backings 16, as in FIG. 10, and place it on the aluminum block 34. Then the stencil 21 is layed-up in a hydraulic press 32 and laminated to a screen 12 against aluminum block 34. The other protective backing 16 protects the film surface from damage by the press 32. The chase 28 is assembled to the screen 12 at the time the stencil 21 is layed-up in the press 32, as illustrated in FIG. 11. The press laminates the stencil 21 to the screen 12 by the application of heat and pressure for a selected interval of time. Satisfactory results have been obtained at a temperature of 300° F. and a pressure of 250 psi for from six to ten seconds. Other temperatures and pressures can be used. The resulting stencil 21 must be stripped of the protective backings 16, as in FIG. 12, and the film is then developed to harden the exposed areas. The resulting stencil 21 is identical to the stencil 11 previously discussed, and already mounted in the chase, as in FIG. 13. It is then utilized by depositing or squeegeeing the fluid or solder paste through stencil 21 for deposit on the part, in the manner shown in FIG. 7.

The process that has previously been described produces a stencil which has a desired thickness and is capable of producing a deposited image of a uniform selected thickness. This renders the stencil useful for applications requiring relatively thick deposition of material such as solder pastes for the filliting of microchips to pads. The invention is also useful in producing stencils having a controlled or uniform thickness.

Many other advantages of the present invention are as follows:

The method is very simple to apply. It results in excellent definition. The film to image resolution is approximately 1:1. The screen is immediately strippable and reusable. Turn around time is approximately 10 minutes. The method and apparatus can achieve controlled thicknesses.

Modifications and adaptations, in the method and materials of fabrications, in the configuration and assemblage of the constituent elements are readily permissible within the scope of the invention, which changes are intended to be embraced therewithin.

Having described my invention, I now claim:

1. A method of making a dry film stencil comprising the steps of:
   selecting an open mesh support screen
   selecting and laminating a facing layer and a backing layer of dry film photoresist together through and from opposite sides of said screen by applying pressure thereto for forming a film laminate,
   exposing the film laminate through a transparency for forming an exposed film, and p1 developing the film for thereby forming a screen stencil of the developed film laminate.

2. The method of claim 1 including the step of selecting said backing layer to have a thickness at least equal to the thickness of said support screen.

3. The method of claim 1 wherein the step of selecting said facing layer includes selecting a layer of film equal to the desired thickness of the material to be deposited through said stencil.

4. The method of claim 1 wherein the step of laminating said layers of photoresist together includes the step of applying heat simultaneously with the step of applying pressure thereto.

5. The method of claim 1 including the step of laminating at least a second layer of dry film photoresist to said facing layer for obtaining a desired thickness of said screen stencil.

6. The method of claim 1 wherein said pressure is applied to said layers of dry film photoresist by means of a pair of opposed rollers.

7. The method of claim 6 including applying heat to said layers by heating said rollers.

8. The method of claim 7 wherein the step of selecting said layers includes selecting said layers to have different thicknesses.

9. The method of claim 8 including the step of laminating at least a second layer of photoresist to said facing layer.

10. The method of claim 9 wherein:
    the exposing step comprises exposing only the facing layer of the film laminate.

11. The method of claim 9 wherein:
    the facing layer and the backing layer are initially provided with protective backings,
    removing the protective backing from one side of each of the layers before laminating the layers of dry film photoresist to the screen.

12. The method of claim 9 including the step of:
    placing the exposed and developed laminate in a chase.

13. A method of making a dry film stencil comprising the steps of:
    laminating two layers of dry film photoresist together to form a film laminate,
    exposing the film laminate through a transparency thereby forming an exposed film laminate,
    attaching the exposed film laminate to a screen by pressing the laminate onto the screen for a period of between 6 and 10 seconds at a pressure of approximately 250 psi and at a temperature of up to 300° F.,
    developing the exposed film laminate to thereby form a stencil.

14. The method of claim 13 wherein:
    the layers of film are selected to have protective backings,
    and removing some of the protective backings after exposing the layers of film.

15. The method of claim 13 wherein the attaching step include first placing said screen in a chase; then assembling the laminate layers of film to the screen; and finally laminating said layers to said screen in said chase.

16. The method of claim 13 including the step of:
    depositing a fluid material on a surface by squeegeeing solder paste through the open areas defined by the stencil.

17. The method of claim 13 including:
    selecting each layer of film photoresist to have a thickness of two mils.

18. A film screen laminate for the production of screen stencils comprising:
    an open mesh support screen,
    a facing layer of dry film photoresist having a predetermined uniform thickness disposed on one side of said screen, and
    a backing layer of dry film photoresist disposed on the other side of said screen,
    portions of at least one of said layers extending through the open mesh of said screen and bonded to the other of said layers.

19. The film screen laminate of claim 18 wherein said facing layer and said backing layer are of different thicknesses.

20. The film screen laminate of claim 19 wherein said backing layer is at least as thick as the wire in said screen.

21. The film screen laminate of claim 18 including at least a second layer of dry film photoresist bonded to said facing layer.

22. the film screen laminate of claim 18 wherein said layers are fused together.

* * * * *

UNITED STATES PATENT AND TRADEMARK OFFICE
CERTIFICATE OF CORRECTION

PATENT NO. : 4,176,602

DATED : December 4, 1979

INVENTOR(S) : Phyllis A. Feddersen

It is certified that error appears in the above-identified patent and that said Letters Patent are hereby corrected as shown below:

In Claim 1, Column 7, line 9, delete "pl".

*Signed and Sealed this*

*Twenty-fifth* Day of *March 1980*

[SEAL]

Attest:

SIDNEY A. DIAMOND

*Attesting Officer*  *Commissioner of Patents and Trademarks*